(12) United States Patent
Wang (10) Patent No.: US 8,242,825 B2
(45) Date of Patent: *Aug. 14, 2012

(54) METHOD AND APPARATUS FOR PULSE WIDTH MODULATION

(75) Inventor: Zhao-Jun Wang, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/350,455

(22) Filed: Jan. 13, 2012

(65) Prior Publication Data

US 2012/0112846 A1    May 10, 2012

Related U.S. Application Data

(63) Continuation of application No. 12/976,316, filed on Dec. 22, 2010, now Pat. No. 8,138,810, which is a continuation of application No. 12/608,845, filed on Oct. 29, 2009, now Pat. No. 7,880,523, which is a continuation of application No. 11/543,503, filed on Oct. 4, 2006, now Pat. No. 7,629,823.

(51) Int. Cl.
*H03K 3/017* (2006.01)
(52) U.S. Cl. ......................... 327/172; 327/170
(58) Field of Classification Search .......... None
See application file for complete search history.

(56) References Cited

U.S. PATENT DOCUMENTS

| | | | |
|---|---|---|---|
| 5,379,321 A | 1/1995 | Girmay | |
| 5,502,419 A | 3/1996 | Kawasaki et al. | |
| 6,107,851 A | 8/2000 | Balakirshnan et al. | |
| 6,229,366 B1 | 5/2001 | Balakirshnan et al. | |
| 6,819,154 B2 | 11/2004 | Greenfeld | |
| 6,930,520 B2 | 8/2005 | Solie | |
| 7,268,639 B2 | 9/2007 | Matsushita | |
| 7,378,889 B2 | 5/2008 | Wu | |
| 7,642,820 B2 * | 1/2010 | Chen et al. | 327/131 |
| 7,880,523 B2 * | 2/2011 | Wang | 327/172 |

(Continued)

FOREIGN PATENT DOCUMENTS

CN    1805281 A    7/2006

(Continued)

OTHER PUBLICATIONS

EP 07 25 3930—European Search Report, dated Aug. 6, 2010 (4 pages).

(Continued)

*Primary Examiner* — Cassandra Cox
(74) *Attorney, Agent, or Firm* — Blakely Sokoloff Taylor & Zafman LLP (57) ABSTRACT

An integrated control circuit according to aspects of the present invention includes a capacitor to develop a first current during a first time duration in response to a charge current and to develop a second voltage during a second time duration in response to a discharge current. A comparator is also included and is coupled to the capacitor to indicate when the voltage on the capacitor reaches the second voltage. A control logic sets a duty ratio of a periodic output signal in response to the time it takes the capacitor to discharge from the first voltage to the second voltage. An oscillator is coupled to provide a timing signal to the control logic. In one aspect, the control logic includes an output that is coupled to the oscillator to change a frequency of the oscillator.

15 Claims, 7 Drawing Sheets

U.S. PATENT DOCUMENTS

| | | |
|---|---|---|
| 2004/0150439 A1 | 8/2004 | Greenfeld |
| 2005/0253636 A1 | 11/2005 | Yang et al. |
| 2005/0270008 A1 | 12/2005 | Kuo |
| 2006/0109039 A1 | 5/2006 | Wu |
| 2006/0152184 A1 | 7/2006 | Matsushita |
| 2006/0197569 A1 | 9/2006 | Capodivacca et al. |

FOREIGN PATENT DOCUMENTS

| | | |
|---|---|---|
| JP | 60-018016 | 1/1985 |

OTHER PUBLICATIONS

CN 200710192911.9—First Chinese Office Action, mailed Feb. 21, 2011 (16 pages).

CN 200710192911.9—Second Chinese Office Action, issued Nov. 17, 2011, with English Translation (14 pages).

* cited by examiner

METHOD AND APPARATUS FOR PULSE WIDTH MODULATION

REFERENCE TO PRIOR APPLICATION

This application is a continuation of U.S. application Ser. No. 12/976,316, filed Dec. 22, 2010, now pending, which is a continuation of and claims priority to U.S. application Ser. No. 12/608,845, filed Oct. 29, 2009, now issued U.S. Pat. No. 7,880,523, which is a continuation of and claims priority to U.S. application Ser. No. 11/543,503, filed Oct. 4, 2006, now issued U.S. Pat. No. 7,629,823 entitled, "Method and Apparatus for Pulse Width Modulation." U.S. application Ser. No. 12/976,316 and U.S. Pat. Nos. 7,880,523, and 7,629,823 are hereby incorporated by reference.

BACKGROUND INFORMATION

1. Field of the Disclosure

The present invention relates generally to power supplies and, more specifically, the present invention relates to a pulse width modulator circuit.

2. Background

Many switching power supplies use pulse width modulation to regulate an output. A pulse width modulator receives a control signal that is related to the value of the output. The pulse width modulator then sets the conduction time of the switch as a fraction of a switching period according to the value of the control signal. The fraction of the switching period that is the conduction time is the duty ratio of the switch.

The change in duty ratio in response to a change in control signal is a measure of the gain of the pulse width modulator. The gain of the modulator is typically well controlled because the gain has a strong influence on the stability and the dynamic response of the system.

Traditional pulse width modulators use a voltage comparator to compare a control voltage to a triangular or sawtooth voltage from an oscillator. The output of the comparator is the pulse width modulated signal. In applications where the control signal is a current instead of a voltage, a resistor converts the current to a voltage for input to the comparator. The value of the resistor is typically well controlled because it is directly proportional to the gain of the modulator. A problem arises when the traditional technique is used in integrated circuits because it is expensive to implement an integrated resistor with a precise value that does not change with temperature and variations in the process of fabrication.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for providing a pulse width modulated signal that is responsive to a current. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or subcombinations in one or more embodiments. In addition, it is appreciated that the figures provided herewith are for explanation purposes to persons ordinarily skilled in the art and that the drawings are not necessarily drawn to scale.

In various examples of circuits according to the teachings of the present invention, a pulse width modulated signal that is responsive to a current is provided. Example methods include features that may be beneficial for use in integrated circuits. In particular, example circuits in accordance with the teachings of the present invention may be useful in integrated circuits that control switching power supplies.

In one aspect of the invention, there may be substantially no dependence on the value of a resistor to convert a control current to a pulse width modulated signal. Instead, according to various examples, the method uses a current proportional to the control current to charge a capacitor for a known time within the period of an oscillator. A known current then discharges the capacitor. The time for the voltage on the capacitor to go from its initial value to a reference voltage determines the duty ratio as a fraction of the period of the oscillator in accordance with the teachings of the present invention.

In this way, the nature of example circuits makes the duty ratio independent of the value of the capacitor, or for example the value of a reference voltage, or for example the delay of a comparator, or for example the value of another circuit element such as for example the value of a resistor. When used in an integrated circuit, it is easy to trim the currents to obtain the desired precision of parameters. Another aspect of examples of the present invention includes allowing a mode of modulation to change among constant on-time, constant off-time, and constant frequency modes while maintaining a constant modulator gain.

Figure 1:
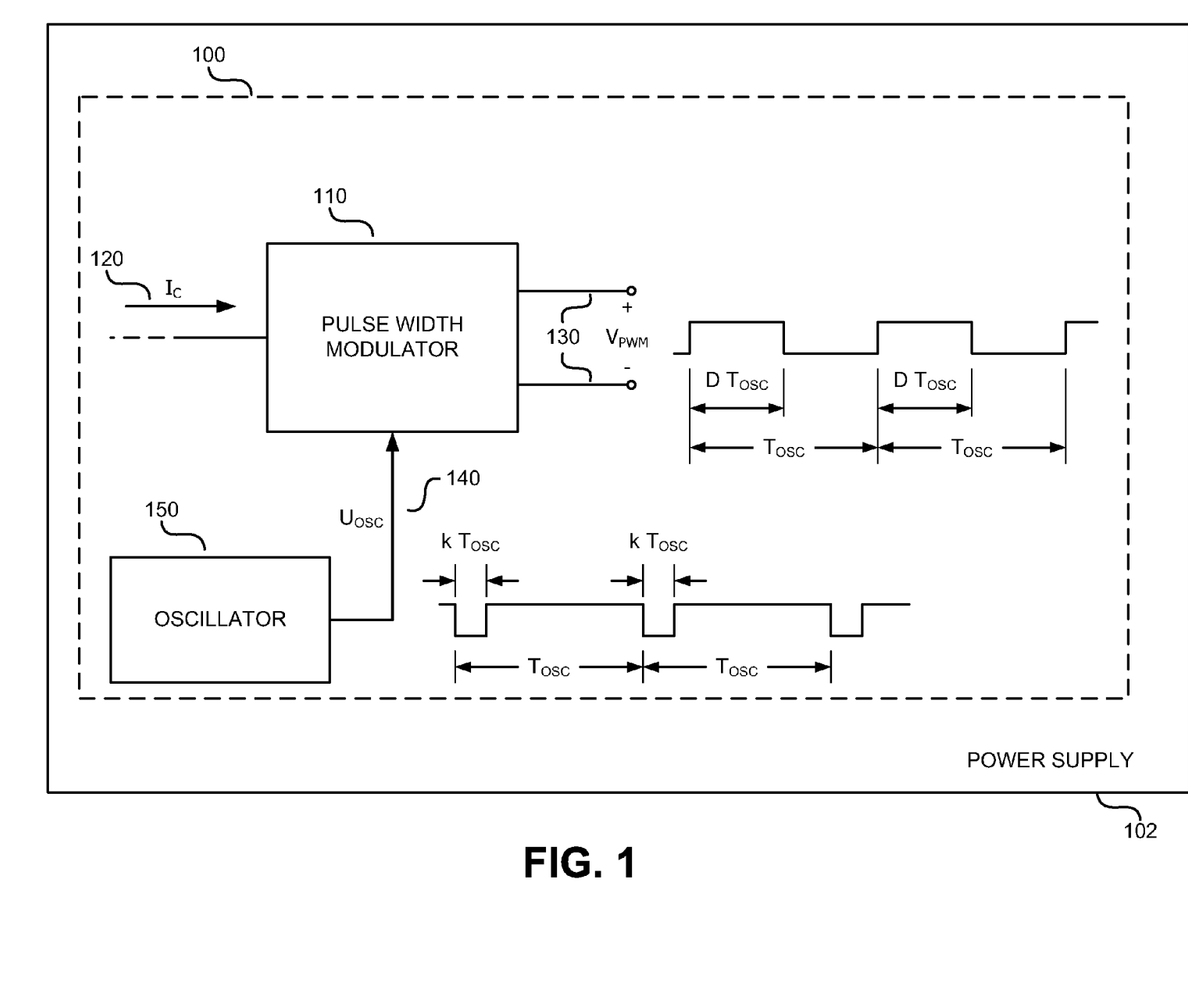
FIG. 1 is a block diagram illustrating generally an example duty ratio control circuit in accordance with the teachings of the present invention.

To illustrate, FIG. 1 is a block diagram that illustrates generally one example duty ratio circuit in accordance with the teachings of the present invention. As shown, a duty ratio control circuit 100 includes a pulse width modulator circuit 110 and an oscillator 150. As shown in FIG. 1, one example of duty ratio control circuit 100 is included in an integrated circuit that is coupled to control a power supply 102. The pulse width modular circuit 110 receives a timing signal $U_{OSC}$ 140 from the oscillator 150 to produce a pulse width modulated signal 130 that is a voltage $V_{PWM}$ in the example of FIG. 1. Timing signal $U_{OSC}$ 140 may be either a voltage or a current. In the example, timing signal $U_{OSC}$ 140 is periodic with a period $T_{OSC}$. Timing signal $U_{OSC}$ is low for a fraction k of period $T_{OSC}$ and is high for the remainder of period $T_{OSC}$. Pulse width modulated signal 130 is high for a fraction D of period $T_{OSC}$, where D is the duty ratio. The pulse width modulator circuit 110 also receives a control current $I_C$ 120. In one example, control current $I_C$ 120 adjusts the duty ratio D.

Figure 2:
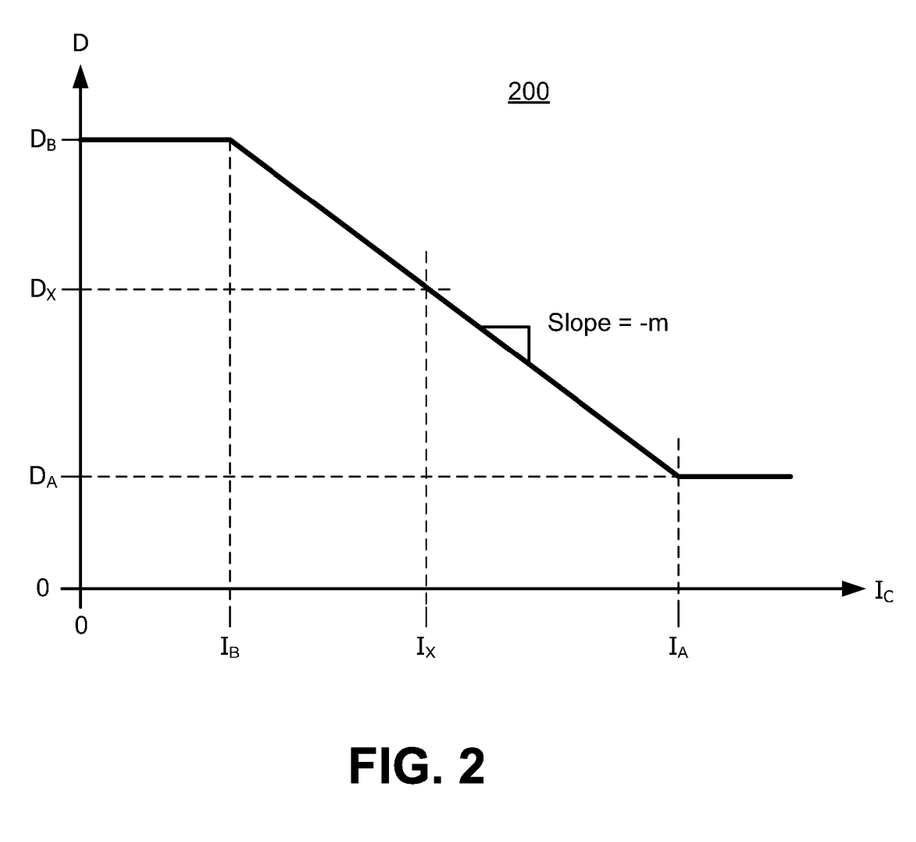
FIG. 2 is a graph illustrating generally a response of a pulse width modulator circuit of an example duty ratio control circuit in accordance with the teachings of the present invention.

FIG. 2 is a graph illustrating generally a desired response of a pulse width modulator circuit in accordance with the teachings of the present invention. The graph 200 shows how a duty ratio D changes in response to a control current $I_C$. In the example, the duty ratio D is a maximum value $D_B$ for control current less than $I_B$, and a minimum value $D_A$ for control current greater than $I_A$. The duty ratio is a value $D_X$ that is between $D_A$ and $D_B$ when the control current is a value $I_X$ that is between $I_A$ and $I_B$. The gain of the pulse width modulator between control currents $I_A$ and $I_B$ is the slope −m. The pulse width modulator gain m in the example of FIG. 2 has the units of reciprocal amperes.

Figure 3:
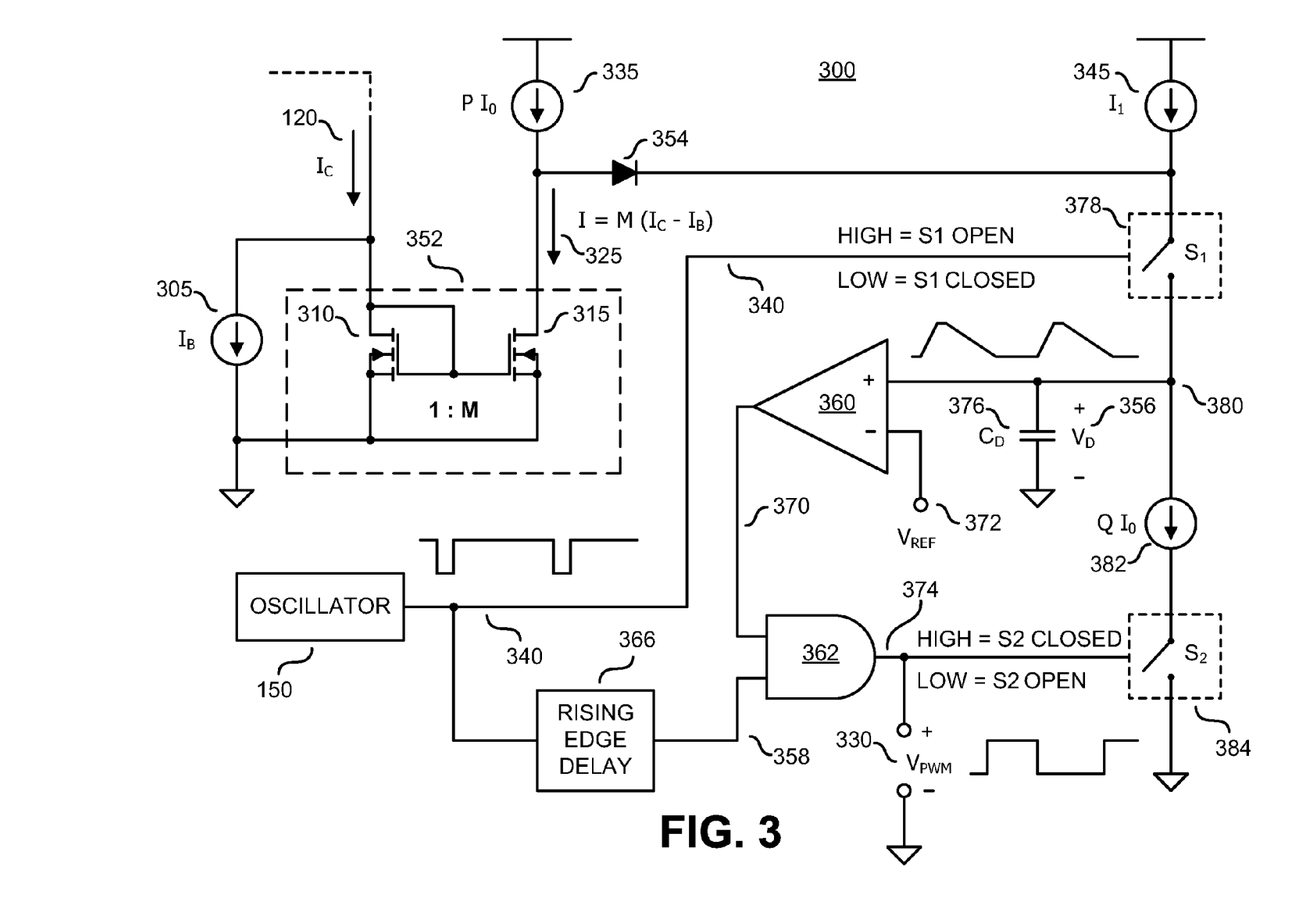
FIG. 3 is a schematic diagram illustrating generally an example duty ratio control circuit that produces the response of the graph in FIG. 2 in accordance with the teachings of the present invention.

FIG. 3 is a schematic diagram of one example of a duty ratio control circuit 300 that produces the response similar to graph 200 in accordance with the teachings of the present invention. As shown, the circuit 300 receives control current $I_C$ 120. A current source 305 subtracts a current $I_B$ from control current $I_C$ 120. The difference between control current $I_C$ 120 and current $I_B$ from control current 305 is received by transistor 310 at the input of current mirror 352. Transistors 310 and 315 of current mirror 352 have strengths in the respective ratio of 1:M so that the mirrored current 325 is the input current multiplied by the scale factor M.

In the example of FIG. 3, oscillator 150 provides a timing signal 340 that controls a switch $S_1$ 378. When the timing signal 340 is low, switch $S_1$ 378 closes to charge a capacitor $C_D$ 376 with a current that is the sum of current $I_1$ from current source 345 and the current through rectifier 354. Current through a rectifier 354 is the difference between the current from current source 335 and the mirrored current 325 when the difference is positive. Current through rectifier 354 is zero when the mirrored current 325 is greater than the current from current source 335. In one example, rectifier 354 includes a diode.

Voltage $V_D$ 356 on capacitor $C_D$ 376 is compared to a reference voltage $V_{REF}$ 372 by a comparator 360. The output 370 of comparator 360 is high when voltage $V_D$ 356 is greater than reference voltage $V_{REF}$ 372. The output 370 of comparator 360 is low when voltage $V_D$ 356 is less than reference voltage $V_{REF}$ 372.

As shown in the illustrated example, a delaying circuit 366 is coupled to delay the rising edge of the signal from oscillator 150. In the example, delaying circuit 366 is included to compensate for a non-ideal response of comparator 360 that in one example may be a delay in the response of comparator 360. A delayed timing signal 358 from delaying circuit 366 and output 370 of comparator 360 are received as inputs to an AND gate 362. The output 374 of AND gate 362 controls a switch $S_2$ 384. The output of AND gate 362 is also the pulse width modulated signal 330. When the output 374 of AND gate 362 is high, switch $S_2$ closes to discharge capacitor $C_D$ 376 with current source 382.

Figure 4:
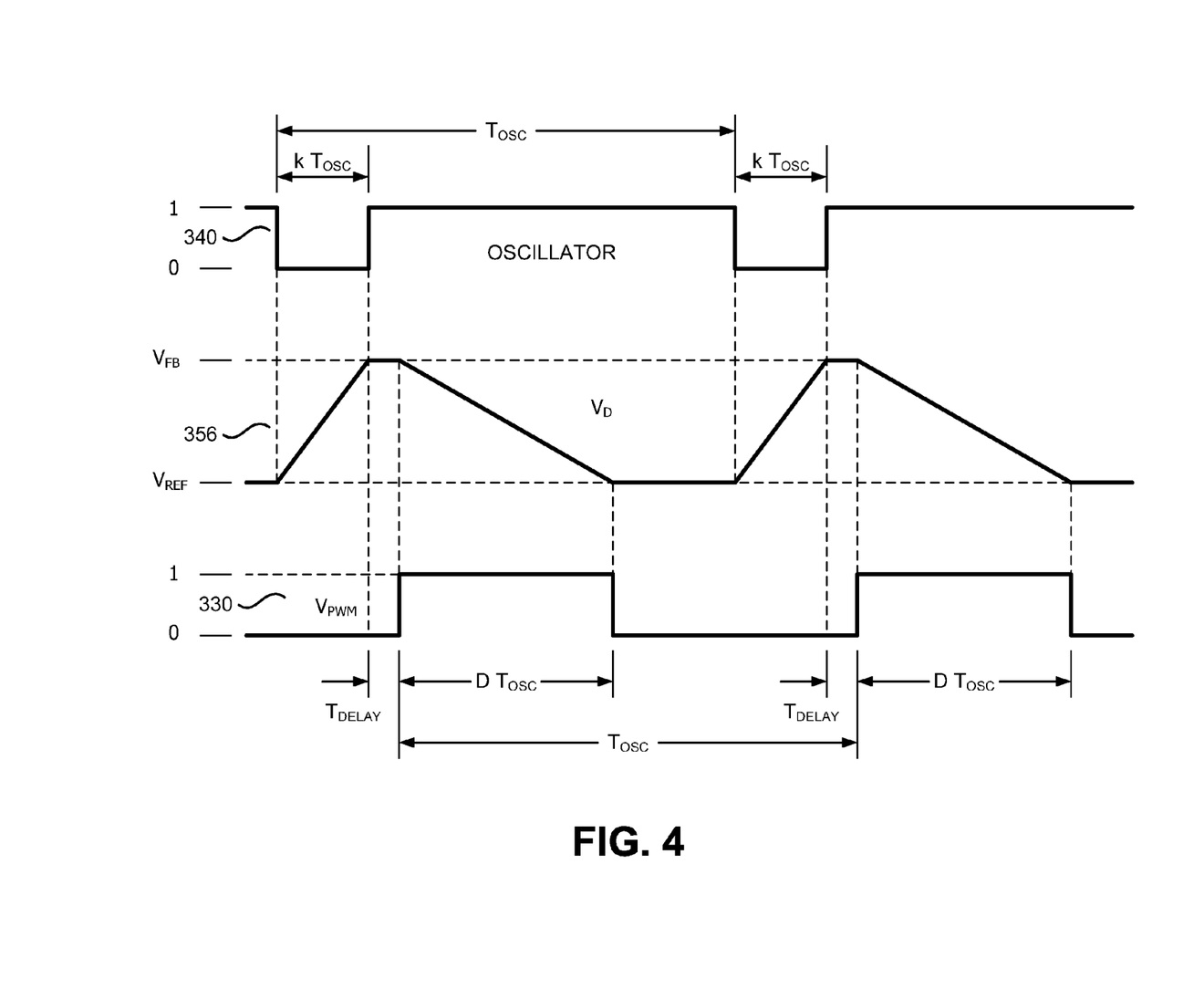
FIG. 4 is a diagram illustrating generally timing relationships of signals in the duty ratio control circuit of FIG. 3.

FIG. 4 illustrates example timing relationships of three signals in the duty ratio control circuit example of FIG. 3. In the example, FIG. 4 shows a timing signal 340 received by the pulse width modulator circuit from oscillator 150, an example diagram of voltage $V_D$ 356 on capacitor $C_D$ 376, and an example pulse width modulated signal 330 produced by circuit 300. When the example circuit 300 of FIG. 3 operates, voltage $V_D$ 356 increases from a value $V_{REF}$ to a value $V_{FB}$ as capacitor $C_D$ 376 charges during a time that is a fraction k of the period $T_{OSC}$ of timing signal 340. The fraction k may be chosen to set a substantially guaranteed limit on the maximum duty ratio from the pulse width modulator, since the output or signal 330 of the pulse width modulator must be low for substantially the same duration as the fraction k of the period $T_{OSC}$.

Capacitor $C_D$ 376 charges with current $I_1$ from current source 345 added to the current in rectifier 354. Capacitor $C_D$ will charge with current $I_1$ when the control current $I_C$ 120 is large enough to make the current in rectifier 354 zero. The value of current $I_1$ is therefore chosen in one example to guarantee that the pulse width modulator signal 330 is high for a minimum duration during each period of the timing signal 340 from oscillator 150.

After the timing signal 340 from oscillator 150 goes high, the voltage $V_D$ 356 on capacitor $C_D$ 376 remains at a value $V_{FB}$ during the delay $T_{DELAY}$ from delaying circuit 366. After the delay $T_{DELAY}$ from delaying circuit 366, current source 382 discharges capacitor $C_D$ 376 with a fraction Q of a reference current $I_0$.

As can be seen in the illustrated example, pulse width modulator signal 330 is high while capacitor $C_D$ 376 discharges from the voltage $V_{FB}$ to voltage $V_{REF}$. In the example, the fraction Q of the reference current $I_0$ is a multiplier less than one that may be selected along with the selection of the values of the multiplier P, the fraction k, and the current $I_1$ as an adjustment on the discharge current from capacitor $C_D$ 376 to reduce the discharge current sufficiently to substantially guarantee that the maximum duty ratio is determined by the timing signal 340 from oscillator 150. In some examples, it may be desirable to have the oscillator 150 dominate the timing relationships in examples where the frequency of the oscillator is a trimmed parameter of an integrated circuit. Thus, in the example, duty ratio D is the fraction of the period $T_{OSC}$ of oscillator 150 that corresponds to either the time duration while capacitor $C_D$ 376 is discharging from the value $V_{FB}$ to the value $V_{REF}$, or the time duration of a high level of timing signal 340, whichever is less.

The duty ratio D and the slope m of the pulse width modulator or PWM gain are given for $I_A > I_C > I_B$ by the expressions $$D = \frac{k}{QI_0}[PI_0 + I_1 - M(I_C - I_B)]$$

$$m = \frac{Mk}{QI_0}$$

where $I_0$ is a bias current that may be selected from considerations of power dissipation or other design rules for an integrated circuit. In one example, current $I_1$ 345 is selected to determine a minimum duration for the pulse width modulator signal 330 to be high in applications that may require it. The fraction k determines the maximum duty ratio. In one example, the multiplier P of current source 335 in FIG. 3 is chosen to be $$P = \frac{1}{k} - 1$$

Therefore, the duty ratio D is independent of the value of the capacitor $C_D$ 376 or for example a reference voltage or for example another circuit element such as for example the value of a resistor. Although the duty ratio D and the slope m of the PWM gain are independent of the value of capacitor $C_D$ 376, the value and type of capacitor $C_D$ 376 are selected in various examples to meet the environmental requirements of the application. Parameters Q, M, and $I_0$ may be adjusted accordingly.

In one example, $T_{OSC}$ is 7.58 µs corresponding to an oscillator frequency of 132 kHz, for which the other parameters are k=0.2, P=4, Q=0.975, $I_0$=10 µA, $I_1$=610 nA, M=11.21× $10^{-3}$, and the delay time $T_{DELAY}$ of rising edge delaying circuit 366 in FIG. 3 is 150 ns.

Figure 5:
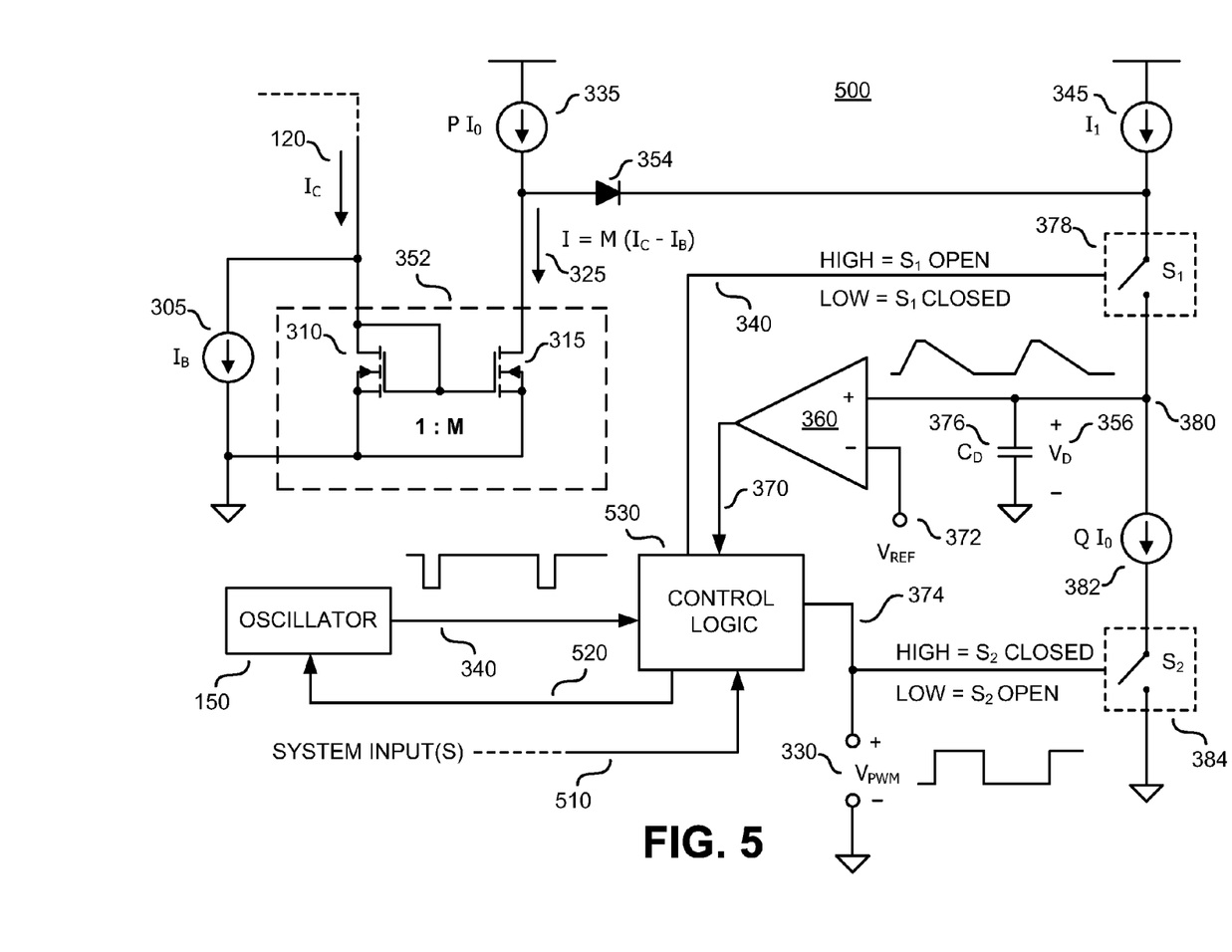
FIG. 5 is a schematic diagram illustrating generally a duty ratio control circuit in accordance with the teachings of the present invention.

FIG. 5 shows an example of a duty ratio control circuit 500 where a control logic 530 receives timing signal 340 from oscillator 150, output 370 of comparator 360, and other signals 510 from the system to control oscillator 150 as well as the switching of switches $S_1$ 378 and $S_2$ 384 that charge and discharge capacitor $C_D$ 376 in accordance with teachings of the invention. In the example, control logic 530 can thus allow a pulse width modulator signal 330 to change its frequency as well as its duty ratio in response to system input(s) 510 from an external system in accordance with the teachings of the present invention.

Figure 6:
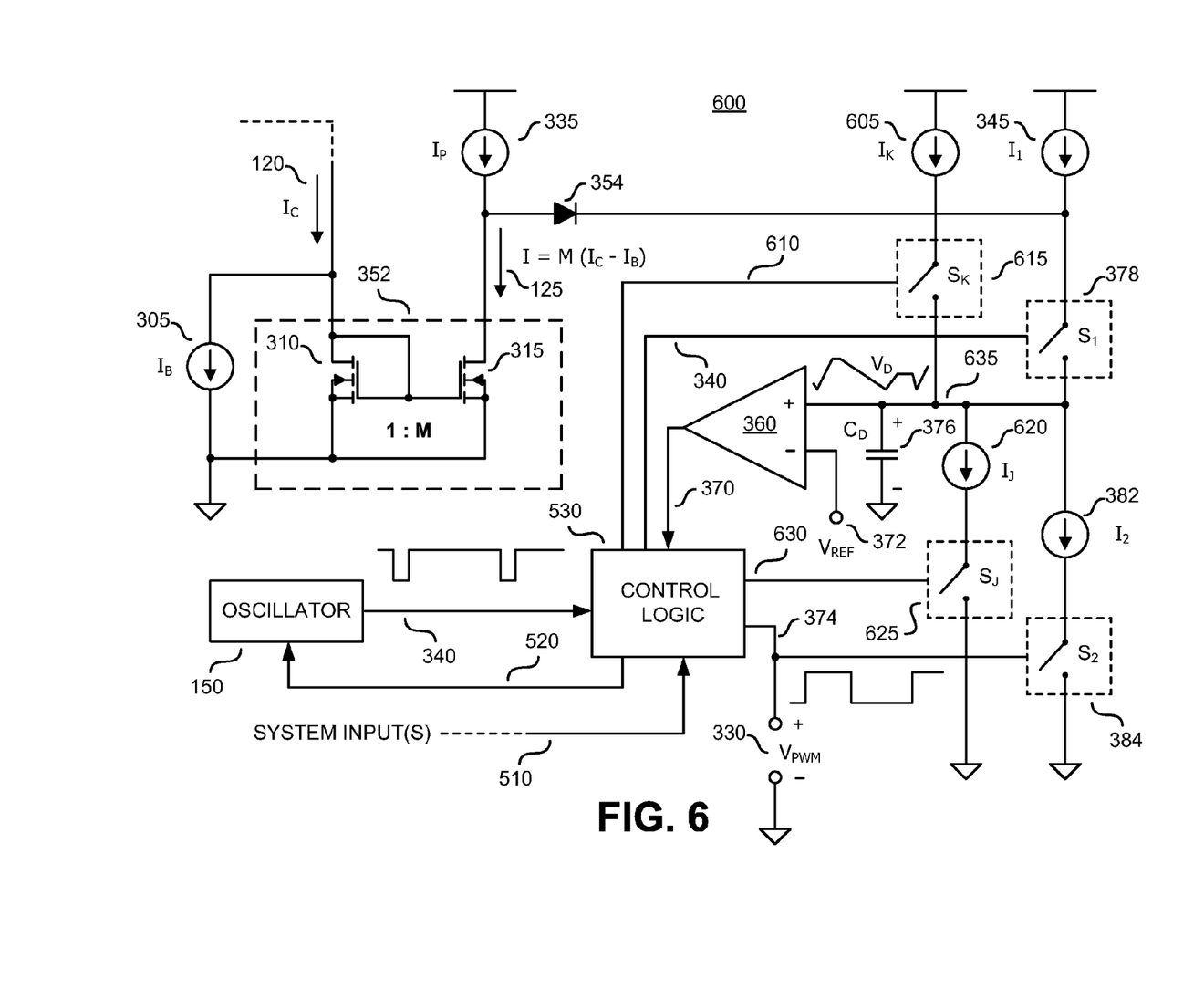
FIG. 6 is a schematic diagram illustrating generally another duty ratio control circuit in accordance with the teachings of the present invention.

FIG. 6 shows an example circuit of a duty ratio control circuit 600 including additional switches $S_J$ 625 and $S_K$ 615 with respective current sources 620 and 605 having respective currents $I_J$ and $I_K$ to charge and discharge capacitor $C_D$ 376, the switching responding to control logic 530 in accordance with teachings of the invention. In one example, control logic 530 causes signals 610 and 630 to switch switches $S_K$ 615 and $S_J$ 625 respectively. An output 520 from control logic 530 changes the frequency of the oscillator 150 according to the state of the output to the output 370 of comparator 360.

Figure 7:
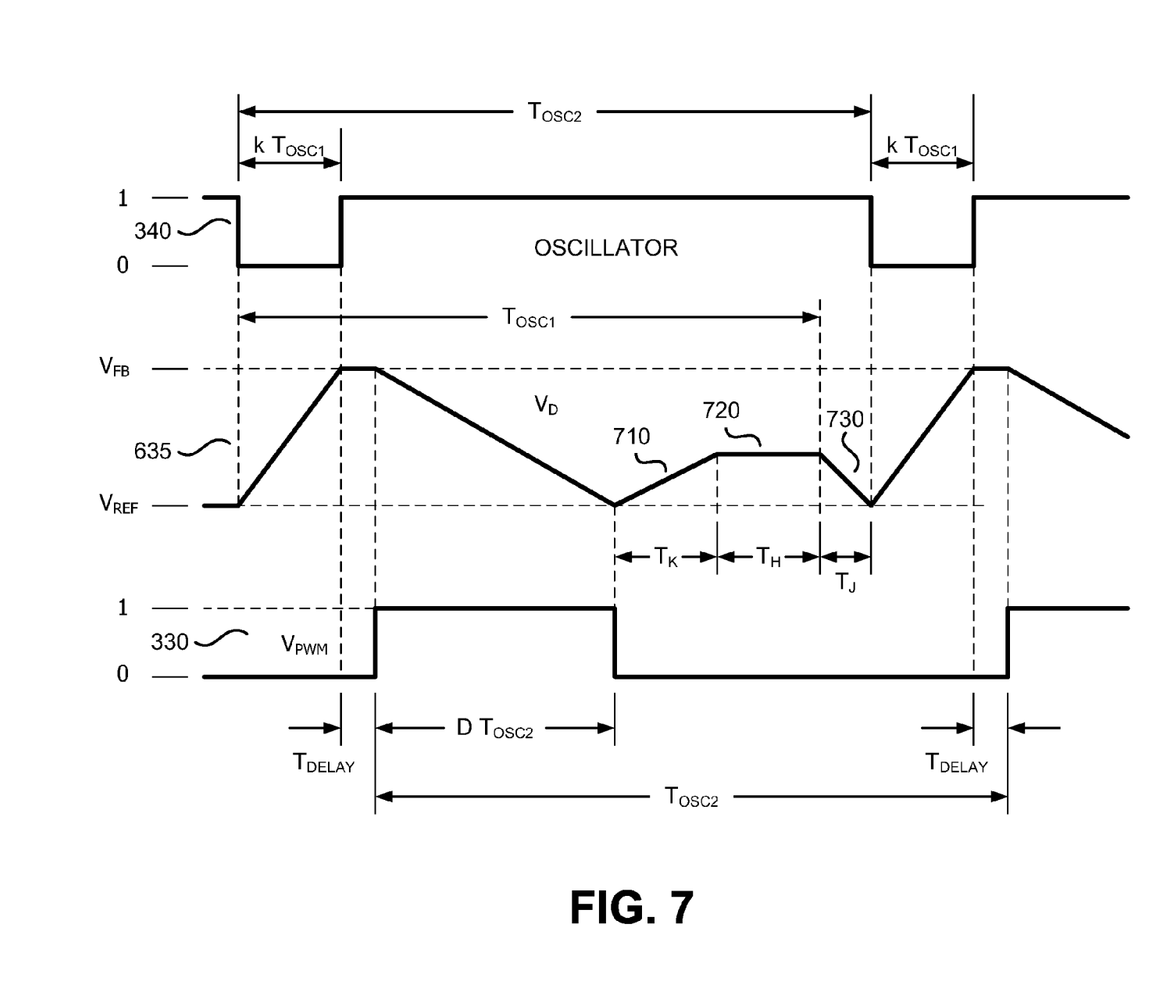
FIG. 7 is a diagram illustrating generally timing relationships of signals in the duty ratio control circuit of FIG. 6 in accordance with the teachings of the present invention.

FIG. 7 illustrates generally one example of the use of switches $S_K$ 615 and $S_J$ 625 to alter the charging and discharging of the capacitor $C_D$ 376. Line segment 710 shows an increase in the voltage $V_D$ 635 for a time $T_K$ while switch $S_K$ 615 is closed. Line segment 720 shows the voltage $V_D$ 635 held constant at a value between $V_{REF}$ and $V_{FB}$ for a time $T_H$ while all switches are open. Line segment 730 shows the voltage $V_D$ 635 decreasing for a time $T_J$ while switch $S_J$ 625 is closed. Control logic 530 responds to the output of comparator 360 to cause the output 340 of oscillator 150 to remain high during the times $T_K$, $T_H$, and $T_J$, thereby increasing the period of the oscillator 150 from a first value $T_{OSC1}$ to a second value $T_{OSC2}$. Thus, the pulse width modulator may contain a plurality of switches and current sources to charge and discharge a capacitor such as capacitor $C_D$ 376 in response to a plurality of inputs 510. The additional switches and current sources may modify the response of the pulse width modulator signal 330 to control current $I_C$ 120 depending on the needs of the system.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An integrated control circuit, comprising:
   a capacitor coupled to develop a first voltage during a first time duration in response to a charge current received by the capacitor and to develop a second voltage during a second time duration in response to a discharge current provided by the capacitor and wherein the charge current is generated in response to a control signal;
   a comparator coupled to the capacitor to generate an output indicating when the capacitor reaches the second voltage;
   a control logic that is coupled to output a periodic output signal, wherein the control logic sets a duty ratio of the periodic output signal in response to a time that it takes the capacitor to discharge from the first voltage to the second voltage; and
   an oscillator coupled to provide a timing signal to the control logic, wherein a period of the periodic output signal is a period of the timing signal, and wherein the control logic includes an output that is coupled to the oscillator to change a frequency of the oscillator.

2. The integrated control circuit of claim 1, wherein the duty cycle of the periodic output signal is substantially independent of the value of the capacitor.

3. The integrated control circuit of claim 1, wherein the duty cycle of the periodic output signal is substantially independent of the value of the second voltage.

4. The integrated control circuit of claim 1, wherein the duty cycle of the periodic output signal is substantially independent of a delay in the response of the comparator.

5. The integrated control circuit of claim 1, wherein the duty cycle of the periodic output signal is substantially independent of the value of a resistor.

6. An integrated control circuit, comprising:
   a capacitor coupled to develop a first voltage during a first time duration in response to a charge current received by the capacitor and to develop a second voltage during a second time duration in response to a discharge current provided by the capacitor and wherein the charge current is generated in response to a control signal;
   a comparator coupled to the capacitor to generate an output indicating when the capacitor reaches the second voltage;
   a control logic that is coupled to output a periodic output signal, wherein the control logic sets a duty ratio of the periodic output signal in response to a time that it takes the capacitor to discharge from the first voltage to the second voltage; and an oscillator coupled to provide a timing signal to the control logic, wherein a period of the periodic output signal is a period of the timing signal, and wherein the control logic changes a frequency of the oscillator in response to the output of the comparator.

7. The integrated control circuit of claim 6, wherein the duty cycle of the periodic output signal is substantially independent of the value of the capacitor.

8. The integrated control circuit of claim 6, wherein the duty cycle of the periodic output signal is substantially independent of the value of the second voltage.

9. The integrated control circuit of claim 6, wherein the duty cycle of the periodic output signal is substantially independent of a delay in the response of the comparator.

10. The integrated control circuit of claim 6, wherein the duty cycle of the periodic output signal is substantially independent of the value of a resistor.

11. An integrated control circuit, comprising:
a capacitor coupled to develop a first voltage during a first time duration in response to a charge current received by the capacitor and to develop a second voltage during a second time duration in response to a discharge current provided by the capacitor and wherein the charge current is generated in response to a control signal;
a comparator coupled to the capacitor to generate an output indicating when the capacitor reaches the second voltage;
a control logic that is coupled to output a periodic output signal, wherein the control logic sets a duty ratio of the periodic output signal in response to a time that it takes the capacitor to discharge from the first voltage to the second voltage; and
an oscillator coupled to provide a timing signal to the control logic, wherein a period of the periodic output signal is a period of the timing signal, and wherein the control logic is to be coupled to receive at least one system input from an external system to change a frequency of the periodic output signal.

12. The integrated control circuit of claim 11, wherein the duty cycle of the periodic output signal is substantially independent of the value of the capacitor.

13. The integrated control circuit of claim 11, wherein the duty cycle of the periodic output signal is substantially independent of the value of the second voltage.

14. The integrated control circuit of claim 11, wherein the duty cycle of the periodic output signal is substantially independent of a delay in the response of the comparator.

15. The integrated control circuit of claim 11, wherein the duty cycle of the periodic output signal is substantially independent of the value of a resistor.

* * * * *